(12) United States Patent
Chang et al.

(10) Patent No.: US 10,613,588 B2
(45) Date of Patent: Apr. 7, 2020

(54) PORTABLE ELECTRONIC DEVICE

(71) Applicant: PEGATRON CORPORATION, Taipei (TW)

(72) Inventors: Cheng-Wen Chang, Taipei (TW); Chen-Yu Tsai, Taipei (TW); Chun-Yuan Wang, Taipei (TW); Cheng-Yi Lee, Taipei (TW)

(73) Assignee: Pegatron Corporation, Taipei (TW)

( * ) Notice: Subject to any disclaimer, the term of this patent is extended or adjusted under 35 U.S.C. 154(b) by 0 days.

(21) Appl. No.: 16/391,786

(22) Filed: Apr. 23, 2019

(65) Prior Publication Data

US 2019/0324502 A1    Oct. 24, 2019

(30) Foreign Application Priority Data

Apr. 24, 2018 (TW) .............................. 107113898 A

(51) Int. Cl.
| | |
|---|---|
| *G06F 1/16* | (2006.01) |
| *H05K 5/00* | (2006.01) |
| *H05K 7/00* | (2006.01) |
| *H04M 1/02* | (2006.01) |
| *G09F 9/30* | (2006.01) |
| *H05K 5/02* | (2006.01) |

(52) U.S. Cl.
CPC .......... *G06F 1/1652* (2013.01); *G09F 9/301* (2013.01); *H04M 1/0268* (2013.01); *H05K 5/0017* (2013.01); *H05K 5/0217* (2013.01)

(58) Field of Classification Search
CPC .... G06F 1/1652; G06F 1/1626; G06F 1/1613; G06F 2203/04105
See application file for complete search history.

(56) References Cited

U.S. PATENT DOCUMENTS

| | | | | |
|---|---|---|---|---|
| 10,162,387 | B2* | 12/2018 | Takayanagi | ........... G06F 1/1615 |
| 2010/0177020 | A1* | 7/2010 | Bemelmans | .............. G09F 9/00 345/55 |
| 2014/0092566 | A1* | 4/2014 | Shirasaka | ............ H05K 5/0017 361/749 |

(Continued)

FOREIGN PATENT DOCUMENTS

| | | |
|---|---|---|
| CN | 201185067 Y | 1/2009 |
| CN | 206541552 U | 10/2017 |

(Continued)

*Primary Examiner* — Anthony M Haughton
(74) *Attorney, Agent, or Firm* — Muncy, Geissler, Olds & Lowe, P.C.

(57) ABSTRACT

The application discloses a portable electronic device comprising a casing, a rotating shaft, a driving assembly, a flexible display and a supporting member. The housing has a long axis opening. The rotating shaft and the driving assembly are disposed in the housing, and the driving assembly is connected to the rotating shaft. The flexible display is wound around the rotating shaft. A first side of the flexible display is connected to the rotating shaft and a second side is located in the long axis opening. A first end of the supporting member is fixed to the driving assembly. When the second side of the flexible display moves outward from the long axis opening, the rotating shaft rotates and drives the driving assembly to drive a second end of the supporting member to move from the long axis opening toward the second side of the flexible display.

11 Claims, 5 Drawing Sheets

(56) References Cited

U.S. PATENT DOCUMENTS

| | | | | |
|---|---|---|---|---|
| 2016/0320804 A1* | 11/2016 | Takayanagi | ............ | G06F 1/1615 |
| 2016/0363960 A1* | 12/2016 | Park | ....................... | G06F 1/1656 |
| 2017/0013705 A1 | 1/2017 | Jahng | | |
| 2017/0064847 A1* | 3/2017 | Lim | ........................... | G09F 9/00 |
| 2018/0114471 A1* | 4/2018 | Park | ........................ | G09F 9/301 |
| 2018/0376603 A1* | 12/2018 | Lee | ....................... | G06F 1/1652 |

FOREIGN PATENT DOCUMENTS

| | | |
|---|---|---|
| CN | 206657598 U | 11/2017 |
| TW | 201705105 A | 2/2017 |

\* cited by examiner

PORTABLE ELECTRONIC DEVICE

CROSS-REFERENCE TO RELATED APPLICATION

This application is based upon and claims priority of Taiwan Patent Application No. 107113898, filed on Apr. 24, 2018, the contents being incorporated herein by reference.

BACKGROUND

1. Technical Field

The present application relates generally to a portable electronic device, and more particularly, to a portable electronic device having a flexible display.

2. Description of the Related Art

As technology advances, portable electronic devices are continuously developed with the goal of being thin, small, and easy-to-carry. The processor's performance is improved and the sizes of the battery and other components are reduced, however, the size of the display is still limited for the user to read and use. Although most displays are inflexible at present, flexible displays made of flexible materials have been developed to replace the inflexible displays in order to facilitate portability.

When the display function is not in use, the flexible display is wound and retracted in a cylindrical casing; when the display function is required, the flexible display is pulled out from the casing to expand. However, if the casing is not equipped with other supporting structures, the user has to hold one side of the flexible display continuously so that the flexible display can remain in the unfolded state, which is inconvenient to the user.

SUMMARY

In view of the above problems, it is an object of the present application to provide a portable electronic device, which provides a novel design of a driving assembly and a supporting member to solve the problem that the prior art portable electronic device does not have a supporting structure to fix the flexible display in the unfolded state.

In order to achieve the object, the present application discloses a portable electronic device comprising a casing, a rotating shaft, a driving assembly, a flexible display, and a supporting member. The casing has a long axis opening. The rotating shaft is disposed in the casing. The driving assembly is disposed in the casing and connected to the rotating shaft. The flexible display is wound around the rotating shaft. The flexible display has a first side and a second side opposing each other, wherein the first side is connected to the rotating shaft and the second side is located in the long axis opening. The supporting member has a first end and a second end opposing each other, wherein the first end is fixed to the driving assembly. When the second side of the flexible display moves outward from the long axis opening, the rotating shaft rotates and drives the driving assembly to drive the second end of the supporting member to move from the long axis opening toward the second side of the flexible display.

According to an embodiment of the present application, the driving assembly comprises a first rotating member and a second rotating member. The first rotating member is connected to the rotating shaft, and the first rotating member rotates in a first plane. The second rotating member is engaged with the first rotating member, and the first end of the supporting member is fixed to the second rotating member. The second rotating member rotates in a second plane, and the second plane is perpendicular to the first plane.

According to an embodiment of the present application, when the second side of the flexible display moves outward from the long axis opening, the rotating shaft rotates and drives the first rotating member to rotate, and the first rotating member drives the second rotating member and the supporting member to rotate.

According to an embodiment of the present application, the supporting member moves from the long axis opening to the second side of the flexible display so as to form a predetermined angle between the supporting member and the rotating shaft, and the predetermined angle is between 80 degrees and 100 degrees.

According to an embodiment of the present application, the flexible display comprises at least one fixing member, when the predetermined angle is formed between the supporting member and the rotating shaft, the fixing member is connected to the second end of the supporting member.

According to an embodiment of the present application, the supporting member has a connecting portion located at the second end of the supporting member, when the predetermined angle is formed between the supporting member and the rotating shaft, the connecting portion is connected to the fixing member.

According to an embodiment of the present application, the fixing member and the connecting portion are magnetically connected to each other.

According to an embodiment of the present application, the fixing member is adjacent to the second side of the flexible display.

According to an embodiment of the present application, the first rotating member and the second rotating member are respectively a gear structure.

According to an embodiment of the present application, the casing further comprises an opening, and one end of the rotating shaft protrudes out of the opening.

According to an embodiment of the present application, the portable electronic device further comprises a coil spring, wherein one end of the coil spring is fixed to the rotating shaft, and the other end of the coil spring is fixed to the second side of the flexible display.

According to an embodiment of the present application, the supporting member is a rod.

As described above, the portable electronic device of the present application comprises the casing, the rotating shaft, the driving assembly, the flexible display, and the supporting member. The flexible display is wound around the rotating shaft, the driving assembly is connected to the rotating shaft, and the supporting member is fixed to the driving assembly. When the flexible display moves outward, the rotating shaft rotates and drives the driving assembly to drive the supporting member to move outward to support the flexible display in the unfolded state, so that the user does not need to hold the flexible display continuously.

DETAILED DESCRIPTION OF THE PREFERRED EMBODIMENT

In order to make the structure and characteristics Was well as the effectiveness of the present application to be further understood and recognized, the detailed description of the present application is provided as follows along with embodiments and accompanying figures.

Figure 1:
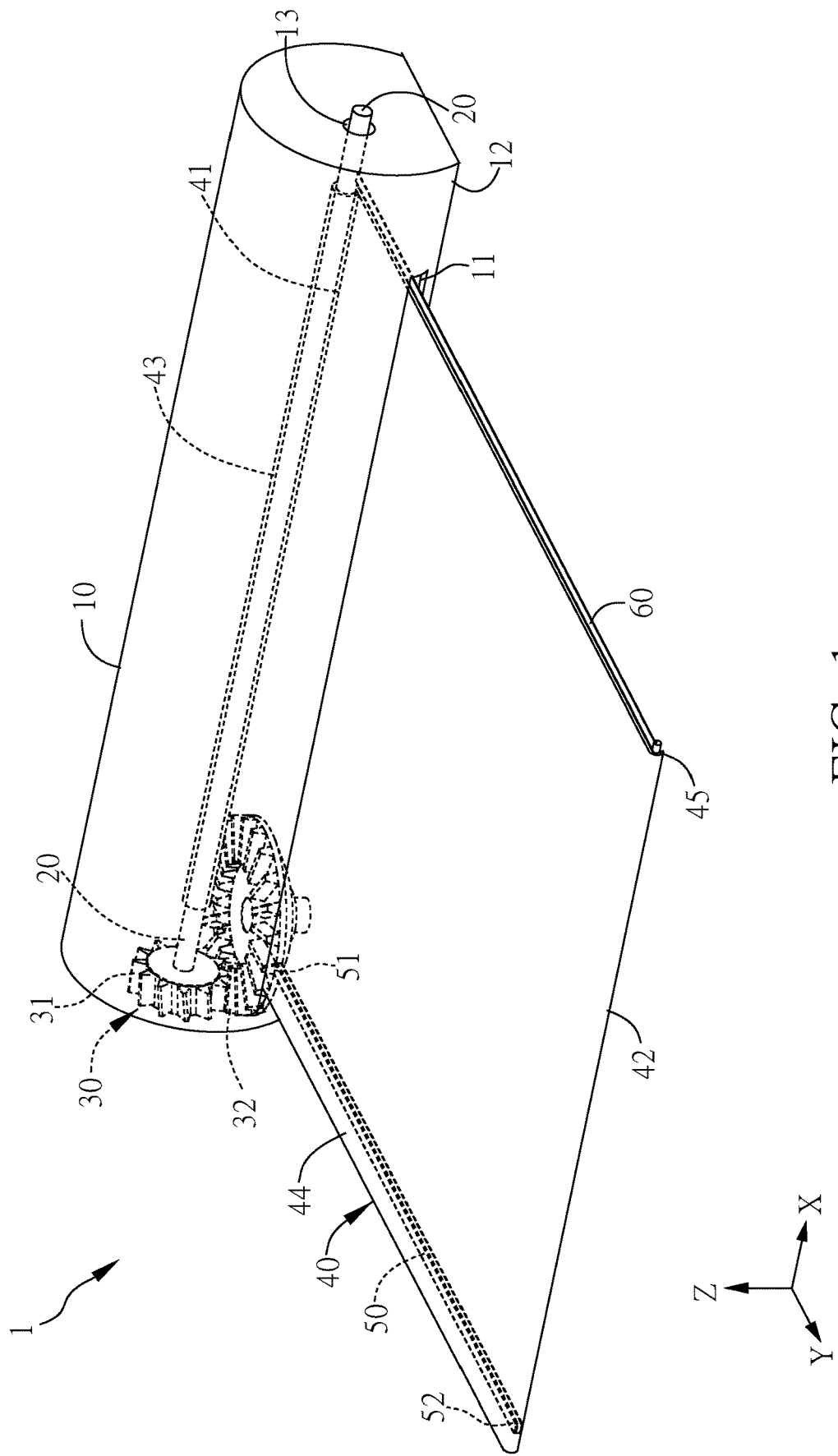
FIG. 1 illustrates a schematic view of a portable electronic device according to an embodiment of the present application.
Figure 2:
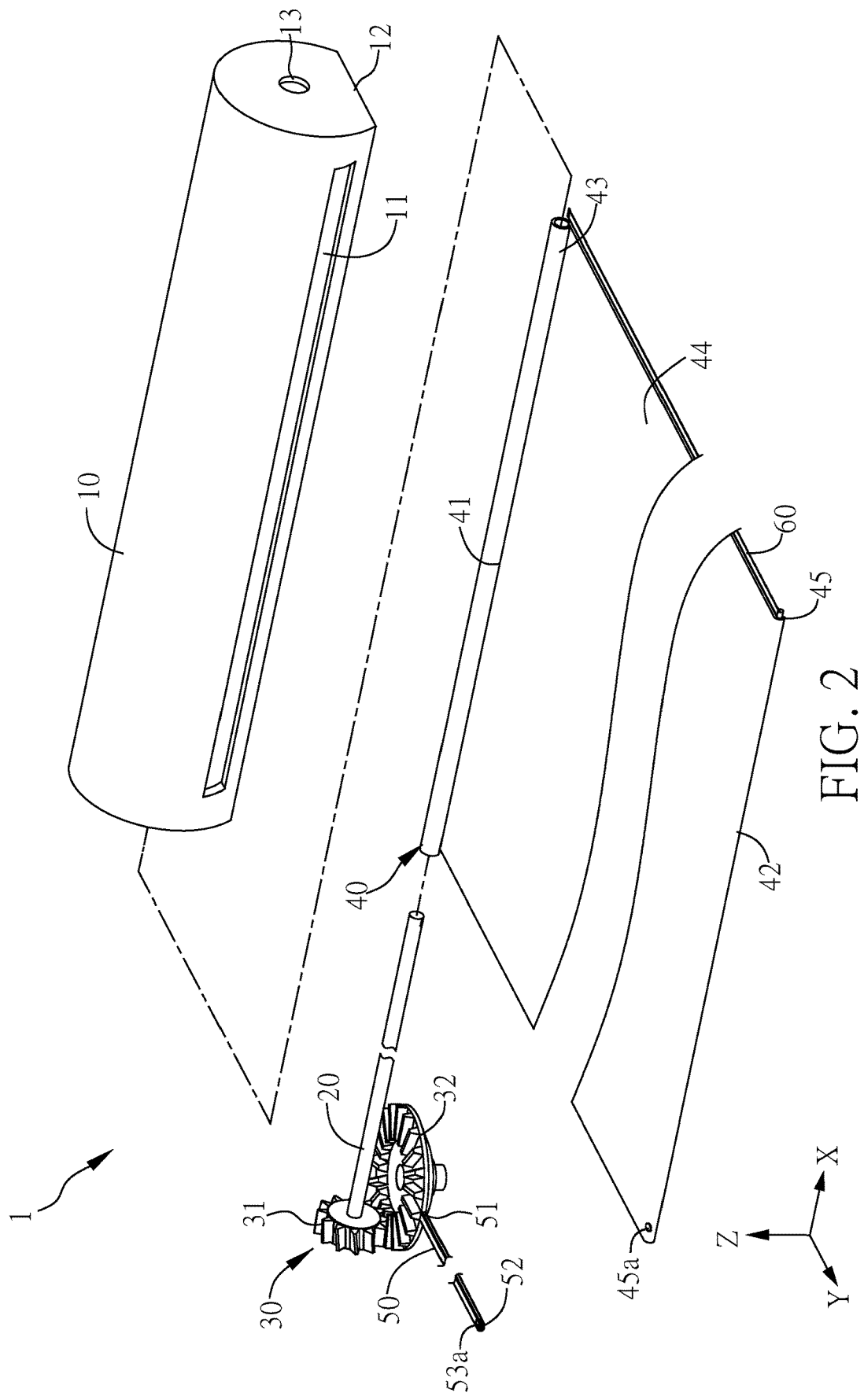
FIG. 2 illustrates an explosive view of the portable electronic device of the portable electronic device shown in FIG. 1.

FIG. 1 illustrates a schematic view of a portable electronic device according to an embodiment of the present application; FIG. 2 illustrates an explosive view of the portable electronic device shown in FIG. 1. Please refer to both FIG. 1 and FIG. 2. A portable electronic device 1 of this embodiment comprises a casing 10, a rotating shaft 20, a driving assembly 30, a flexible display 40, and a supporting member 50. The casing 10 of this embodiment is an elongated columnar body, and the casing 10 has a long axis opening 11. The long axis opening 11 extends along the long axis direction of the casing 10. The rotating shaft 20, the driving assembly 30, and the supporting member 50 are disposed in the casing 10, and one portion of the flexible display 40 is disposed in the casing 10, and the other portion of the flexible display 40 can be pulled from the long axis opening 11 to move to the outside of the casing 10.

Figure 3:
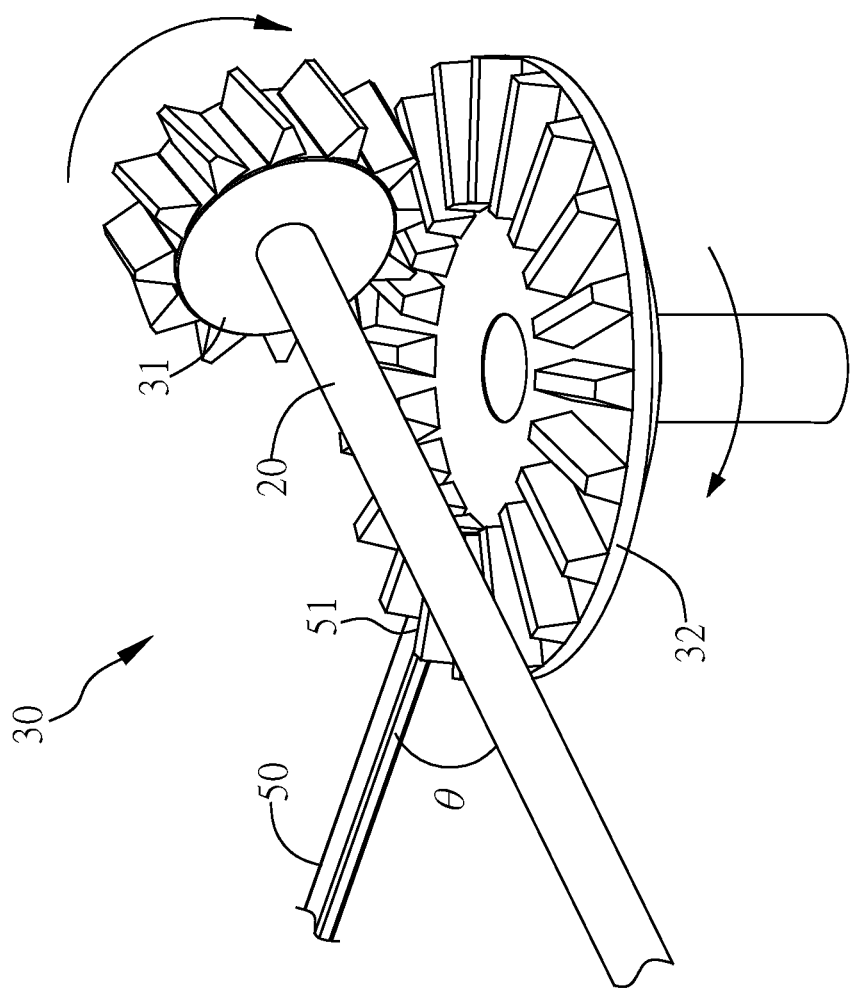
FIG. 3 illustrates an enlarged view of a driving assembly of the portable electronic device shown in FIG. 1.

The long axis direction of the rotating shaft 20 is parallel to the long axis direction of the casing 10, and the driving assembly 30 is connected to the rotating shaft 20. Therefore, when the rotating shaft 20 rotates, the driving assembly 30 can be driven to rotate at the same time. In the present embodiment, the driving assembly 30 comprises a first rotating member 31 and a second rotating member 32, and the first rotating member 31 is connected to the rotating shaft 20. FIG. 3 illustrates an enlarged view of the driving assembly shown in FIG. 1. In the present embodiment, the first rotating member 31 is a gear structure and is fixed to one end of the rotating shaft 20. Therefore, when the rotating shaft 20 rotates, the first rotating member 31 also rotates with the rotating shaft 20 in a first plane, such as the first plane formed by the Y-axis and the Z-axis shown in FIG. 3. Moreover, the second rotating member 32 is engaged with the first rotating member 31, and the second rotating member 32 of the present embodiment is also a gear structure, so as to be further engaged with gear structure of the first rotating member 31.

Therefore, when the first rotating member 31 rotates, the second rotating member 32 can also be driven to rotate. The second rotating member 32 is rotated in a second plane, such as the second plane formed by the X-axis and the Y-axis shown in FIG. 3. The first plane and the second plane are perpendicular to each other. In detail, the first rotating member 31 of the present embodiment is perpendicular to the bottom 12 of the casing 10 and rotates in the same direction as the rotating shaft 20. Refer to FIG. 1 and FIG. 3, the second rotating member 32 is disposed at the bottom 12 of the casing 10, so that the first rotating member 31 rotates in a direction perpendicular to that of the second rotating member 32. In other embodiments, the rotation of the directions perpendicular to each other can be achieved by other mechanisms.

The flexible display 40 of the embodiment is wound around the rotating shaft 20 and can be disposed in the casing 10. In this embodiment, the flexible display 40 has a first side 41 and a second side 42 opposing each other. The first side 41 and the second side 42 of the flexible display 40 refer to the two sides of flexible display 40 parallel to the long axis direction of the housing casing 10 and the shaft, one is referred to as the first side 41, while the other is referred to as the second side 42. The first side 41 is connected to the rotating shaft 20, and the second side 42 is located at the long axis opening 11.

In detail, the first side 41 of the flexible display 40 has a roller 43. The rotating shaft 20 is sleeved into and fixed to the roller 43, such that the first side 41 is connected to the rotating shaft 20, and the roller 43 can be rotated along with the rotating shaft 20. Moreover, the flexible display 40 further comprises a flexible display portion 44, wherein one end of the flexible display portion 44 is connected to the roller 43 and is electrically connected to the hardware component in the roller 43. The flexible display portion 44 can be wound on the roller 43 by fixing one end of the flexible display portion 44 to the roller 43, thereby forming a structure in which the flexible display 40 is wound around the rotating shaft 20. The other end of the flexible display portion 44 is the second side 42 of the flexible display 40 and is located at the long axis opening 11.

In addition, the supporting member 50 has a first end 51 and a second end 5. The first end 51 of the supporting member 50 is fixed to the driving assembly 30, so that the driving assembly 30 can drive the second end 52 of the supporting member 50 to move outwardly from long axis opening 11 and out of the casing 10. In the present embodiment, the first end 51 is directly fixed to the second rotating member 32. In other embodiments, the first end 51 can be indirectly fixed the second rotating member 32. Preferably, the supporting member 50 can be a rod and can be disposed in the casing 10. At this time, the long axis direction of the supporting member 50 and the long axis direction of the rotating shaft 20 are parallel to each other. When the second rotating member 32 rotates, the supporting member 50 can also rotate at the same time to move the second end 52 outwardly from long axis opening 11 and out of the casing 10, thereby enabling supporting member 50 to form a predetermined angle θ with the rotating shaft 20, to support the flexible display portion 44 in the unfolded state.

Figure 4A:
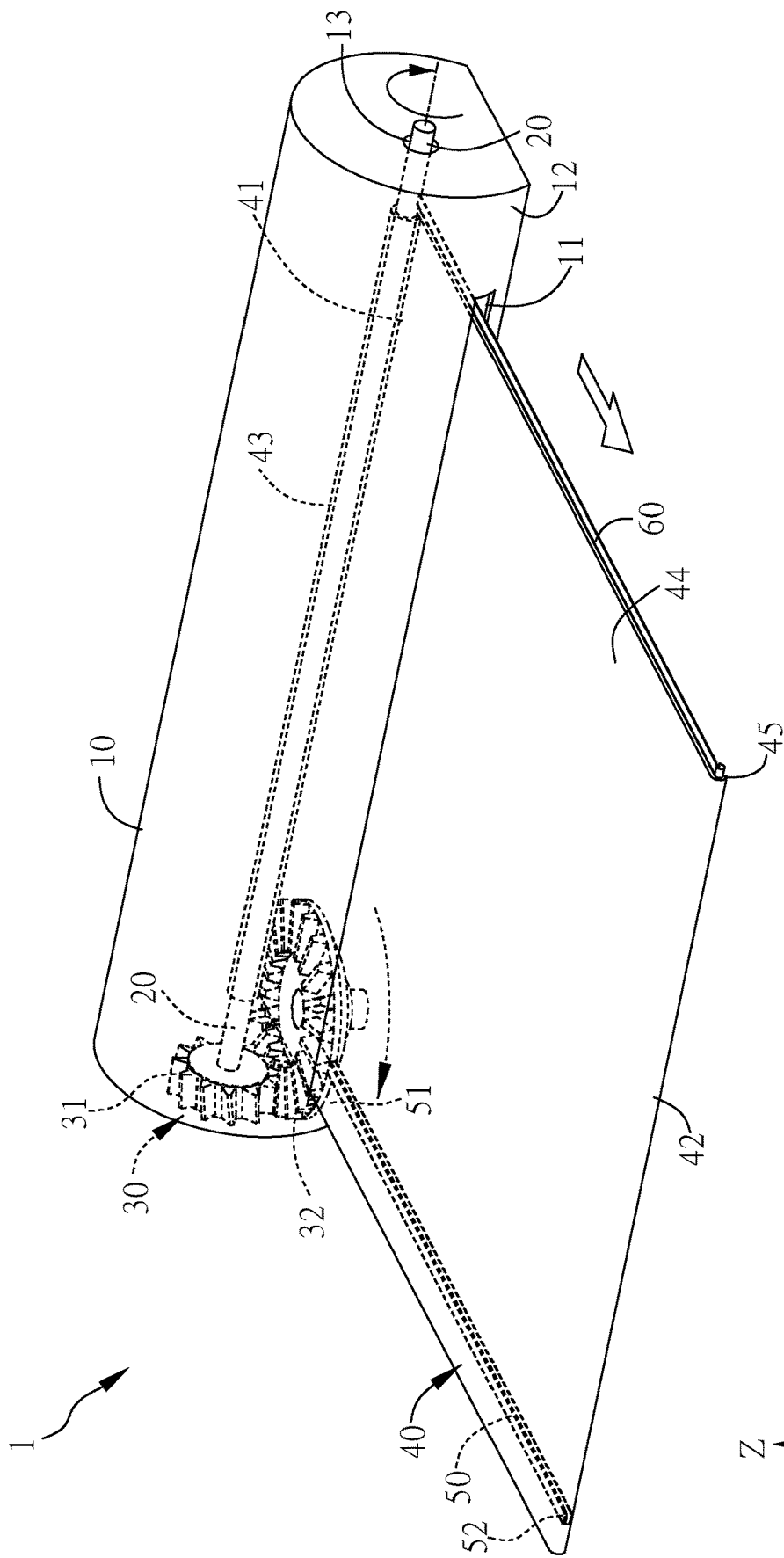
FIG. 4A illustrates a schematic view of the flexible display shown in FIG. 1 in an unfolded state.
Figure 4B:
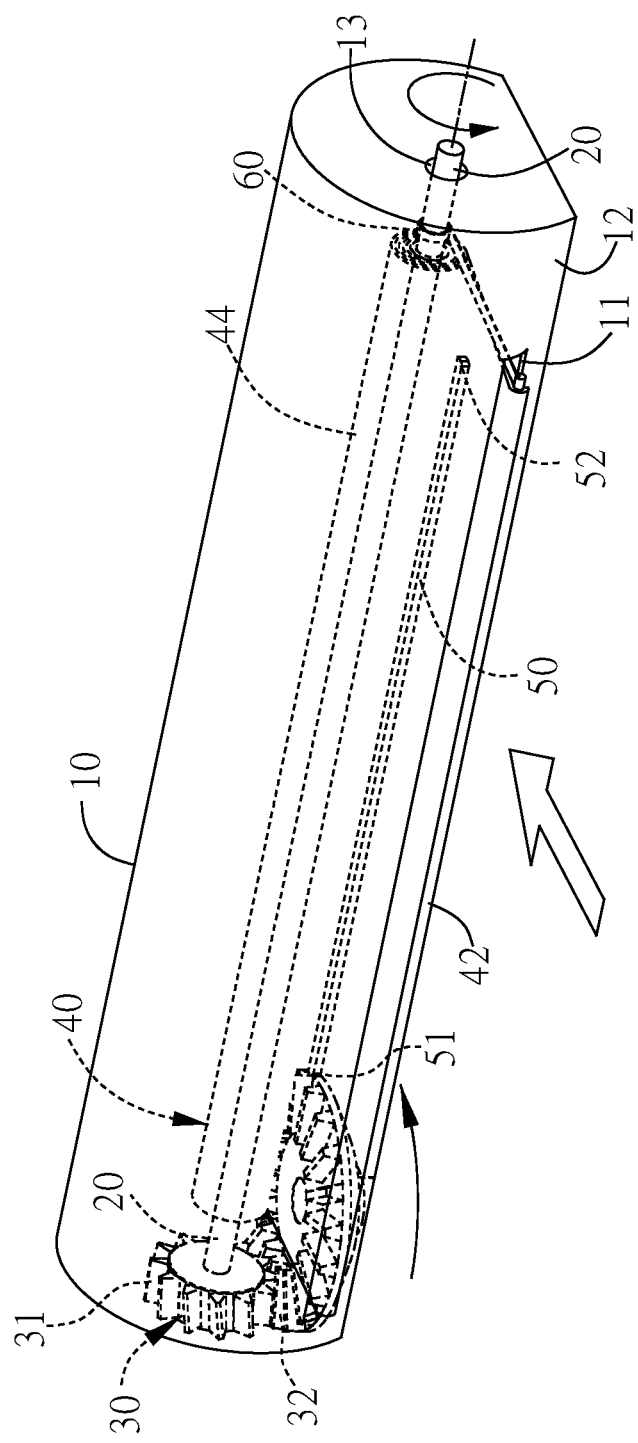
FIG. 4B illustrates a schematic view of the flexible display shown in FIG. 1 in a folded state.

FIG. 4A illustrates a schematic view of the flexible display shown in FIG. 1 in an unfolded state; and FIG. 4B illustrates a schematic view of the flexible display shown in FIG. 1 in a folded state, please refer to both FIG. 4A and FIG. 4B. When the flexible display 40 of the portable electronic device 1 is not in use, the flexible display portion 44 is wound around the roller 43, as shown in FIG. 4B, and is disposed in the casing 10. In this state, the second side 42 of the flexible display 40 is located at the long axis opening 11. When the user wants to operate the flexible display 40, the user can hold the second side 42 and pull the flexible display portion 44 from the long axis opening 11 to assume the unfolded state. When the flexible display portion 44 is pulled out, the roller 43 and the rotating shaft 20 are simultaneously rotated, as indicated by the direction of the arrow symbol shown in FIG. 4A. Since the first rotating member 31 is connected to the rotating shaft 20, the rotating shaft 20 can rotate and drive the first rotating member 31. Furthermore, since the first rotating member 31 and the second rotating member 32 are engaged with each other, and the first end 51 of the supporting member 50 is directly fixed to the second rotating member 32, so that when the first rotating member 31 rotates, the second rotating member 32 and the supporting member 50 can be rotated at the same time.

The supporting member 50, which is originally parallel to the rotating shaft 20, can be rotated with respect to the second rotating member 32 to move outward from the long axis opening 11, until it forms a predetermined angle θ with the rotating shaft 20, as shown in FIG. 3. The predetermined angle θ can be between 80 degrees and 100 degrees, preferably, the predetermined angle θ can be 90 degrees. Since the second rotating member 32 is disposed at the bottom 12 of the casing 10, the supporting member 50 is rotated on the back side of the flexible display portion 44, and when the flexible display portion 44 is pulled, the supporting member 50 is automatically rotated outward at the same time. That is, when the second side 42 of the flexible display 40 is moved outward from the long axis opening 11 (the user pulls the flexible display portion 44), the rotating shaft 20 rotates and drives the second end 52 of the driving supporting member 50 to move from the long axis opening 11 toward the second side 42 of the flexible display 40.

From the view angle of FIG. 4A, the first side 41 and the second side second side 42 of the flexible display 40 are respectively referred to the right side and the left side. Since the supporting member 50 of the embodiment is a rod and the predetermined angle between the supporting member 50 and the rotating shaft 20 is between 80 degrees and 100 degrees, so the supporting member 50 can be located on the upper side of the flexible display portion 44 to avoid causing uneven surface of the flexible display portion 44. In other words, if the supporting member 50 is adjacent to the central position of the flexible display portion 44, the surface of the flexible display portion 44 may be uneven, which may be inconvenient to use. Since the user would hardly use the upper range, the supporting member 50 disposed on the upper side of the flexible display portion 44 can avoid the problem described above. In other embodiments, the position of the second rotating member 32 can also be changed so that the supporting member 50 can be located on the lower side of the flexible display portion 44, which can also avoid the problem described above.

Preferably, the flexible display 40 comprises at least one fixing member 45, and the fixing member 45 is adjacent to the second side 42 of the flexible display 40 and can be disposed according to the rotational configuration of the supporting member 50. For example, the fixing member 45 can be disposed on the upper edge of the second side 42 of the flexible display 40. When a predetermined angle θ is formed between the supporting member 50 and the rotating shaft 20, for example 90 degrees, the fixing member 45 can be interconnected with the second end 52 of the supporting member 50, thereby maintaining the predetermined angle between the supporting member 50 and the rotating shaft 20 at 90 degrees. The fixing member 45 can be a card slot to directly engage with the second end 52 of the supporting member 50 of the rod. Please refer to FIG. 2. Preferably, the fixing member 45a of the embodiment may also be a magnetic member. Correspondingly, the supporting member 50 has a connecting portion 53a located at the second end 52 of the supporting member 50. The fixing member 45a and the connecting portion 53a may be a male and female magnetic buckle respectively. In other words, the fixing member 45a and the connecting portion 53a are magnetically connected to each other. When a predetermined angle θ is formed between the supporting member 50 and the rotating shaft 20, the connecting portion 53a can be magnetically connected to the fixing member 45a to fix the position of the supporting member 50, and to maintain the flexible display portion 44 in the unfolded state at the same time. In other embodiments, the connecting portion 53a and the fixing member 45a may be other components that are connectable and fixed to each other, for example, the fixing member 45a, and the connecting portion 53a may be buckles engaging with each other. It is noted that the application is not limited to the above configuration and can have different implementation.

Preferably, the portable electronic device 1 of the embodiment further comprises a coil spring 60 or a power spring. One end of the coil spring 60 is fixed to the rotating shaft 20, and the other end is fixed to the second side 42 of the flexible display 40. In the embodiment, the coil spring 60 is disposed on the lower side of the flexible display portion 44 and is located between the first side 41 and the second side 42. The coil spring 60 is curled in a free state. As shown in FIG. 4B, when the flexible display portion 44 moves outward from the long axis opening 11, the coil spring 60 gradually deforms (expanding into a strip) and accumulates elastic force. In other words, when the flexible display portion 44 is in the unfolded state, the coil spring 60 is tightened by the expansion, as shown in FIG. 4A. When the flexible display 40 is not in use and the flexible display portion 44 needs to be folded into the casing 10, the flexible display portion 44 can be pulled again, or the flexible display portion 44 can be bended to allow the coil spring 60 to release the elastic force to be curled in the free state, and is then wound together with the flexible display portion 44 on the rotating shaft 20 to achieve the effect of automatically retracting the flexible display portion 44, as shown in FIG. 4B.

In other embodiments, an opening 13 can be disposed in the casing 10, and one end of the rotating shaft 20 can protrude from the opening 13 so that the user can rotate the rotating shaft 20 in reverse, as indicated by the direction of the arrow symbol shown in FIG. 4B. Then the flexible display portion 44 in the unfolded state is wound around the roller 43 and retracted into the casing 10.

In summary, the portable electronic device according to the present application comprises a casing, a rotating shaft, a driving assembly, a flexible display, and a supporting member. The flexible display is wound around the rotating shaft, the driving assembly is connected to the rotating shaft, and the supporting member is fixed to the driving assembly. When the flexible display moves outward, the rotating shaft rotates and drives the driving assembly to drive the supporting member to move outward to support the flexible display in the unfolded state, so that the user does not need to hold the flexible display continuously.

In addition, the driving assembly comprises the first rotating member and the second rotating member engaging with each other. The operation mode of the first rotating member rotating on a plane perpendicular to that of the second rotating member can help save the installation space required for the driving assembly, so it can achieve the objects of providing a portable electronic device having small volume and simple structure.

In addition, the supporting member is rotatably fixed to the second rotating member, so that the supporting member can rotate outwardly with respect to the second rotating member axially, and the supporting member can be located on the upper side of the flexible display, thereby preventing the supporting member from affecting the user's operation.

The objective, means, and efficiency of the present application are all different from conventional characteristics in the prior art. It will be appreciated if the committee can review and grant a patent for the benefit of society. However, it should be noted that the described embodiments are only for illustrative and exemplary purposes, and that various changes and modifications may be made to the described embodiments without departing from the scope of the application as disposed by the appended claims.

What is claimed is:

1. A portable electronic device comprising:
   a casing having a long axis opening;
   a rotating shaft disposed in the casing;
   a driving assembly disposed in the casing, the driving assembly being connected to the rotating shaft;
   a flexible display wound around the rotating shaft, the flexible display having a first side and a second side opposing each other, wherein the first side is connected to the rotating shaft and the second side is located in the long axis opening; and
   a supporting member being a rod and having a first end and a second end opposing each other, wherein the first end is fixed to the driving assembly,
   wherein when the second side of the flexible display moves outward from the long axis opening, the rotating shaft rotates and drives the first end of the supporting member rotate such that the supporting member moves on a back side of the flexible display in a direction from the long axis opening toward the second side of the flexible display.

2. The portable electronic device as claimed in claim 1, wherein the driving assembly further comprises:
   a first rotating member connected to the rotating shaft, the first rotating member rotating in a first plane; and
   a second rotating member engaged with the first rotating member, and the first end of the supporting member being fixed to the second rotating member, the second rotating member rotating in a second plane, and the second plane being perpendicular to the first plane.

3. The portable electronic device as claimed in claim 2, wherein when the second side of the flexible display moves outward from the long axis opening, the rotating shaft rotates and drives the first rotating member to rotate, and the first rotating member drives the second rotating member and the supporting member to rotate.

4. The portable electronic device as claimed in claim 3, wherein the supporting member moves from the long axis opening to the second side of the flexible display so as to form a predetermined angle between the supporting member and the rotating shaft, and the predetermined angle is between 80 degrees and 100 degrees.

5. The portable electronic device as claimed in claim 4, wherein the flexible display comprises at least one fixing member, when the predetermined angle is formed between the supporting member and the rotating shaft, the fixing member is connected to the second end of the supporting member.

6. The portable electronic device as claimed in claim 5, wherein the supporting member has a connecting portion located at the second end of the supporting member, when the predetermined angle is formed between the supporting member and the rotating shaft, the connecting portion is connected to the fixing member.

7. The portable electronic device as claimed in claim 6, wherein the fixing member and the connecting portion are magnetically connected to each other.

8. The portable electronic device as claimed in claim 6, wherein the fixing member is adjacent to the second side of the flexible display.

9. The portable electronic device as claimed in claim 3, wherein the first rotating member and the second rotating member are respectively a gear structure.

10. The portable electronic device as claimed in claim 3, wherein the casing further comprises an opening, one end of the rotating shaft protrudes out of the opening.

11. The portable electronic device as claimed in claim 3 further comprising:
    a coil spring, one end of the coil spring fixed to the rotating shaft, and the other end of the coil spring fixed to the second side of the flexible display.

* * * * *